United States Patent
Arayashiki

(10) Patent No.: US 7,457,592 B2
(45) Date of Patent: Nov. 25, 2008

(54) POLAR MODULATION TRANSMISSION APPARATUS AND WIRELESS COMMUNICATION APPARATUS

(75) Inventor: Mamoru Arayashiki, Yokohama (JP)

(73) Assignee: Panasonic Corporation, Osaka (JP)

( * ) Notice: Subject to any disclaimer, the term of this patent is extended or adjusted under 35 U.S.C. 154(b) by 481 days.

(21) Appl. No.: 11/366,016

(22) Filed: Mar. 2, 2006

(65) Prior Publication Data

US 2006/0205366 A1    Sep. 14, 2006

(30) Foreign Application Priority Data

Mar. 3, 2005    (JP) .............................. 2005-058948

(51) Int. Cl.
*H04B 1/02*    (2006.01)

(52) U.S. Cl. .................... 455/108; 455/110; 455/127.1; 330/295

(58) Field of Classification Search ............... 455/91, 455/108, 110, 127.1, 127.2; 375/297, 300, 375/302; 330/10, 51, 136, 207 A, 251, 295, 330/297

See application file for complete search history.

(56) References Cited

U.S. PATENT DOCUMENTS

| | | | |
|---|---|---|---|
| 6,002,923 A * | 12/1999 | Sahlman | ..................... 455/118 |
| 6,377,784 B2 | 4/2002 | McCune | |
| 6,816,016 B2 * | 11/2004 | Sander et al. | ................ 330/295 |
| 7,072,626 B2 * | 7/2006 | Hadjichristos | ............... 455/108 |
| 7,109,897 B1 * | 9/2006 | Levesque | ................. 455/127.1 |
| 2003/0160658 A1 | 8/2003 | Cioffi et al. | |

FOREIGN PATENT DOCUMENTS

JP    2001320288    11/2001

* cited by examiner

*Primary Examiner*—Quochien B Vuong
(74) *Attorney, Agent, or Firm*—Dickinson Wright, PLLC

(57) ABSTRACT

Polar modulation transmission apparatus capable of suppressing power loss of a battery supply line to a high-frequency power amplifier regardless of whether transmission power is high or low is provided. Operation control section (120) performing control in such a manner that a battery voltage (S21) converted as a result of operation of a DC/DC converter (111) is applied to amplitude signal amplifying section (106) or halting operation of the DC/DC converter (111) in such a manner that battery voltage (S20) is applied directly from the battery (130) based on a transmission power control signal (S14). As a result, when transmission power is low, power loss at the amplitude signal amplifying section (106) is suppressed by DC/DC converter (111), unnecessary operation of DC/DC converter (111) is halted when transmission power is high, and power loss can be suppressed regardless of whether transmission power is high or low.

7 Claims, 9 Drawing Sheets

POLAR MODULATION TRANSMISSION APPARATUS AND WIRELESS COMMUNICATION APPARATUS

BACKGROUND OF THE INVENTION

1. Field of the Invention

The present invention relates to polar modulation transmission apparatus, and particularly relates to polar modulation transmission apparatus and wireless communication apparatus employing this apparatus, provided with an amplitude modulation amplifying section amplifying an amplitude modulation signal according to a battery voltage, and applied with an amplitude modulation signal amplified by the amplitude modulation amplifying section as a battery voltage for a high-frequency power amplifier amplifying power of a phase-modulated high-frequency signal, that may be widely applied, for example, to wireless equipment carrying out wireless communication of a polar modulation scheme such as, for example, communication terminals such as mobile telephones, or base stations, etc.

2. Description of the Related Art

In the related art, a polar modulation method is proposed as technology capable of providing both high power efficiency and linearity. The basic configuration of the polar modulation is such that a high-frequency phase modulation signal is inputted to a signal input terminal of a high-frequency power amplifier and a battery voltage of a level adjusted according to an amplitude modulation signal is applied to a battery voltage input terminal of the high-frequency power amplifier. By this means, a high-frequency phase modulation signal inputted to the high-frequency power amplifier can be taken to be a constant-envelope signal that does not have a fluctuating component in an amplitude direction, so that a highly efficient non-linear amplifier can be used as a high-frequency power amplifier.

A configuration disclosed in U.S. Pat. No. 6,377,784 is shown in FIG. 1 as an example configuration for a polar modulation transmission apparatus of the related art.

Polar modulation transmission apparatus 10 inputs transmission data S1 to modulation encoding section 11. Modulation encoding section 11 forms amplitude modulation signal S2 (for example, $\sqrt{(I^2+Q^2)}$) expressing the transmission data S1 in polar coordinates and phase modulation signal S3 and transmits amplitude modulation signal S2 to amplitude signal amplifying section 13 and phase modulation signal S3 to carrier wave generation/phase modulation section 12.

Carrier wave generation/phase modulation section 12 is comprised of, for example, a frequency synthesizer, forms phase modulation RF signal S4 by modulating a carrier wave using phase modulation signal S3, and transmits this to a signal input terminal of high-frequency power amplifier 14.

On the other hand, polar modulation transmission apparatus 10 forms amplitude modulation signal S5 constituting a battery voltage applied to a battery terminal of high-frequency power amplifier 14 in the following manner. Battery voltage S7 generated by battery 15 is supplied to DC/DC converter 16. As shown in FIG. 2, DC/DC converter 16 regulates the level of battery voltage S7 according to transmission power control signal S8 for controlling final transmission power for transmissions from polar modulation transmission apparatus 10 and supplies the level-adjusted battery voltage S9 to amplitude signal amplifying section 13. Amplitude signal amplifying section 13 is configured from A linear regulator, amplifies amplitude modulation signal S2 (current amplification) according to the value of battery voltage S9 to obtain amplitude modulation signal S5, and applies this to the battery terminal of high-frequency power amplifier 14.

By this means, phase modulation RF signal S4 and amplitude modulation signal S5 are multiplied to obtain RF output signal S6 from high-frequency power amplifier 14. RF output signal S6 is supplied to the transmission antenna (not shown).

A description will be given now for the reason for providing the DC/DC converter 16 at the polar modulation transmission apparatus 10 of FIG. 1.

First, the case where DC/DC converter 16 is not provided, i.e. the case where battery voltage S7 is provided directly (without exception) to amplitude signal amplifying section 13 from battery 15 will be considered. In this case, the following inconveniences occur.

Power loss occurs at the amplitude signal amplifying section 13 according to the difference in potential between the battery voltage (amplitude modulation signal S5) of high-frequency power amplifier 14 and the battery voltage (battery voltage S9) of amplitude signal amplifying section 13. In particular, in the event that the transmission power level (power level of RF output signal S6) is low, the battery voltage of high-frequency power amplifier 14 becomes low. The difference in potential between battery voltage S7 and amplitude modulation signal S5 is therefore amplified, and, as a result, power loss at the amplitude signal amplifying section 13 becomes large.

Because of this, DC/DC converter 16 is provided in the configuration of FIG. 1 in order to reduce power loss at amplitude signal amplifying section 13. Namely, battery voltage S9 supplied to amplitude signal amplifying section 13 is made to change according to a value (transmission power control signal S8) set for the RF output level of high-frequency power amplifier 14 by DC/DC converter 16. In this way, it is possible to make potential difference between the battery voltage S9 and the amplitude modulation signal S5 small even in cases where the level of the RF output signal of the high-frequency power amplifier 14 is low, so that power loss at amplitude signal amplifying section 13 can therefore be suppressed.

However, the configuration of the related art shown in FIG. 1 does not give sufficient consideration to power loss at DC/DC converter 16.

It is possible to make potential difference between the battery voltage S9 and the amplitude modulation signal S5 small in cases where, for example, transmission power (power level of RF output signal S6) is low, and power loss at amplitude signal amplifying section 13 can therefore be effectively suppressed. On the other hand, in the case that transmission power is high, difference in potential between the battery voltage S7 of amplitude signal amplifying section 13 and amplitude modulation signal S5 is small even when there is no DC/DC converter 16 present and power loss therefore occurs at the DC/DC converter 16 regardless of the fact that power loss at amplitude signal amplifying section 13 is small. Providing of the DC/DC converter 16 therefore conversely increases power loss of the whole of the apparatus.

SUMMARY OF THE INVENTION

It is therefore an object of the present invention to provide polar modulation transmission apparatus capable of suppressing power loss of a battery supply line to a high-frequency power amplifier regardless of whether transmission power is high or low and to provide wireless communication apparatus of low power loss. The present invention achieves the aforementioned object by providing polar modulation transmission apparatus with: a high frequency power amplifying section capable of subjecting a phase modulated high frequency signal to power amplification according to a voltage applied to a battery terminal of the high frequency power amplifying section; an amplitude signal amplifying section, amplifying and applying to the battery terminal of the high frequency power amplifying section an amplitude modulation signal according to a voltage value applied from a battery to a battery terminal of the amplitude signal amplifying section; a battery voltage conversion section converting and applying to the battery terminal of the amplitude signal amplifying section a battery voltage from the battery in such a manner that power loss at the amplitude signal amplifying section becomes small; and an operation control section causing the battery voltage conversion section to operate so as to apply the battery voltage converted by the battery voltage conversion section to the battery terminal of the amplitude signal amplifying section or halt operation of the battery voltage conversion section so as to apply the battery voltage from the battery directly, based on a transmission power value.

BRIEF DESCRIPTION OF THE DRAWINGS

The above and other objects and features of the invention will appear more fully hereinafter from a consideration of the following description taken in connection with the accompanying drawings, in which:

FIG. 6 is a characteristic diagram illustrating operation of a battery voltage control section of a second embodiment, where

DETAILED DESCRIPTION OF THE PREFERRED EMBODIMENTS

The following is a detailed description with reference to the drawings of preferred embodiments of the present invention.

First Embodiment

Figure 1:
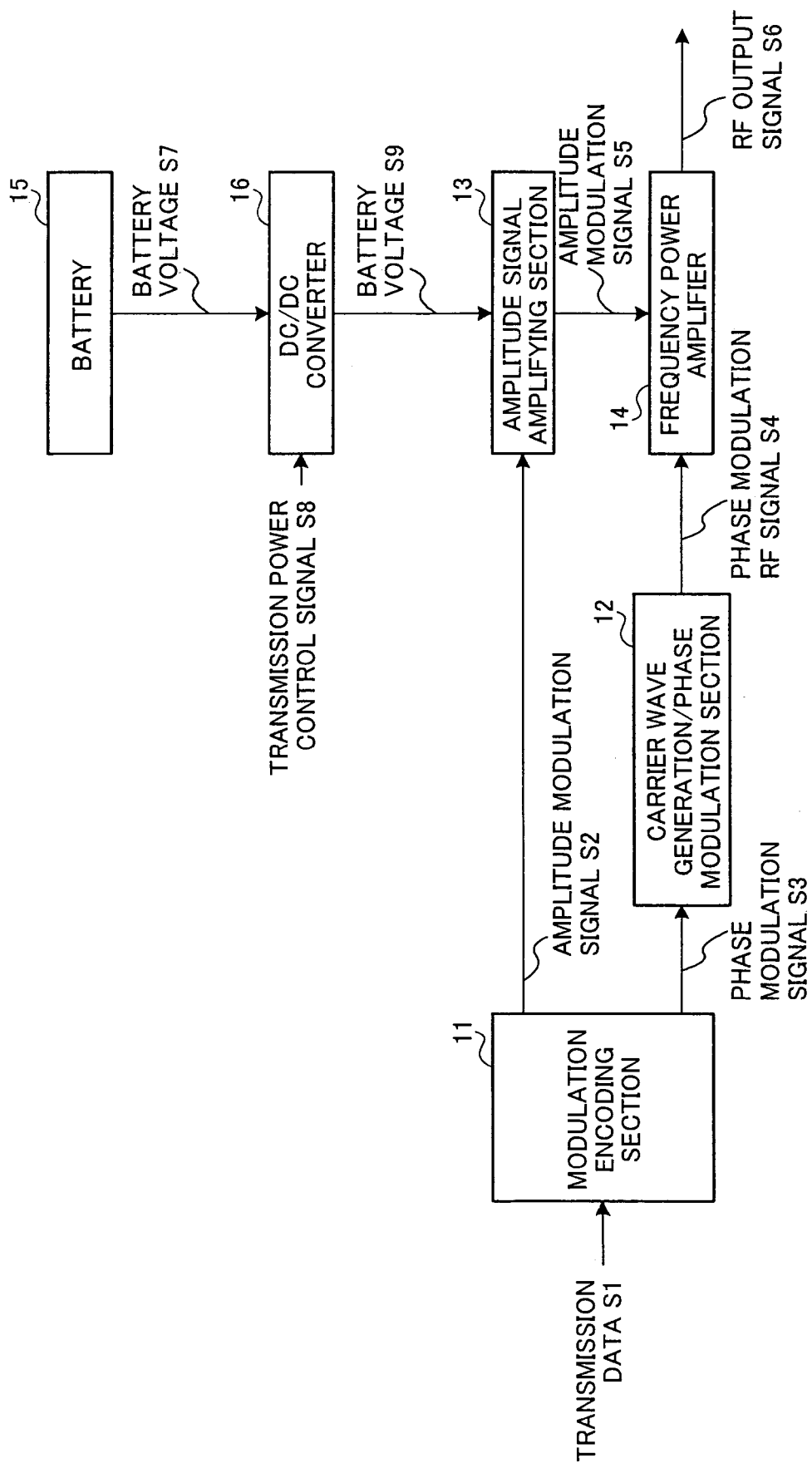
FIG. 1 is a block diagram showing an example configuration for polar modulation transmission apparatus of the related art.
Figure 2:
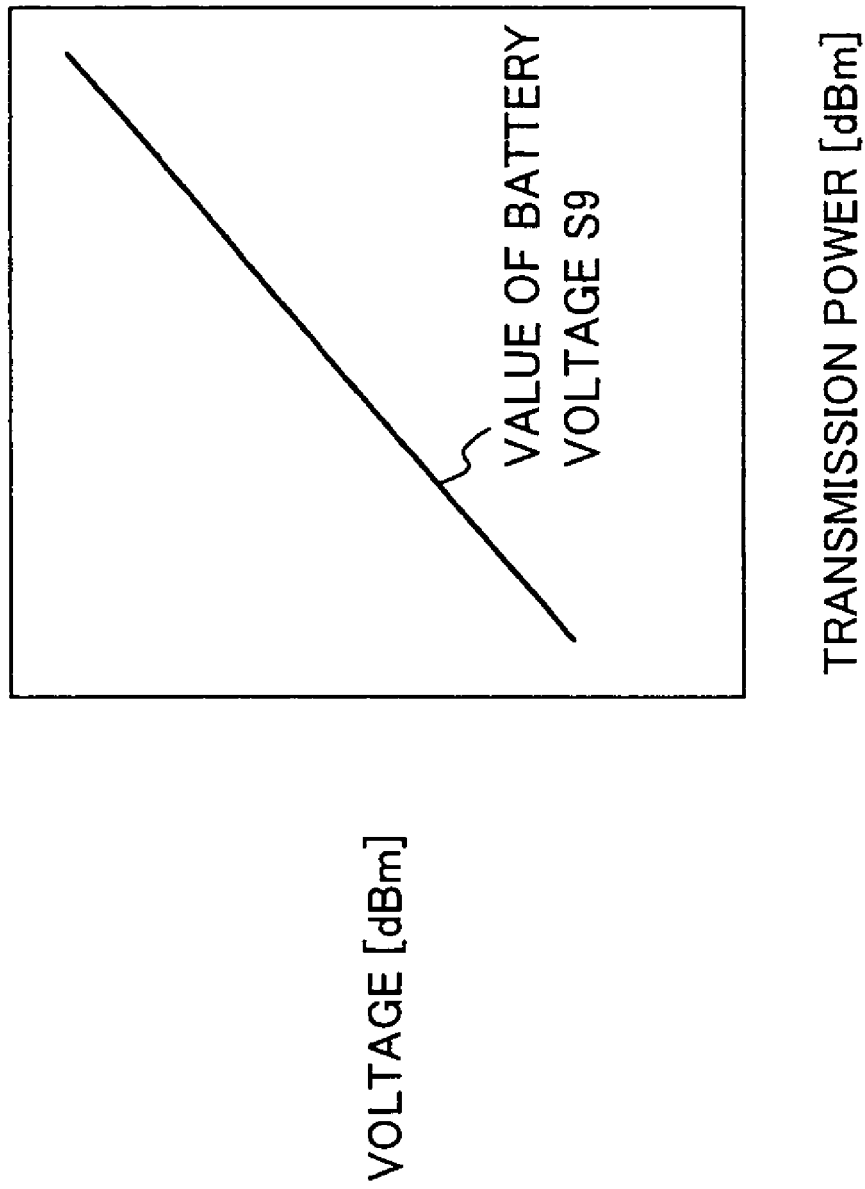
FIG. 2 is a characteristic diagram illustrating the operation of a DC/DC converter taken as a battery voltage control section of the related art.
Figure 3:
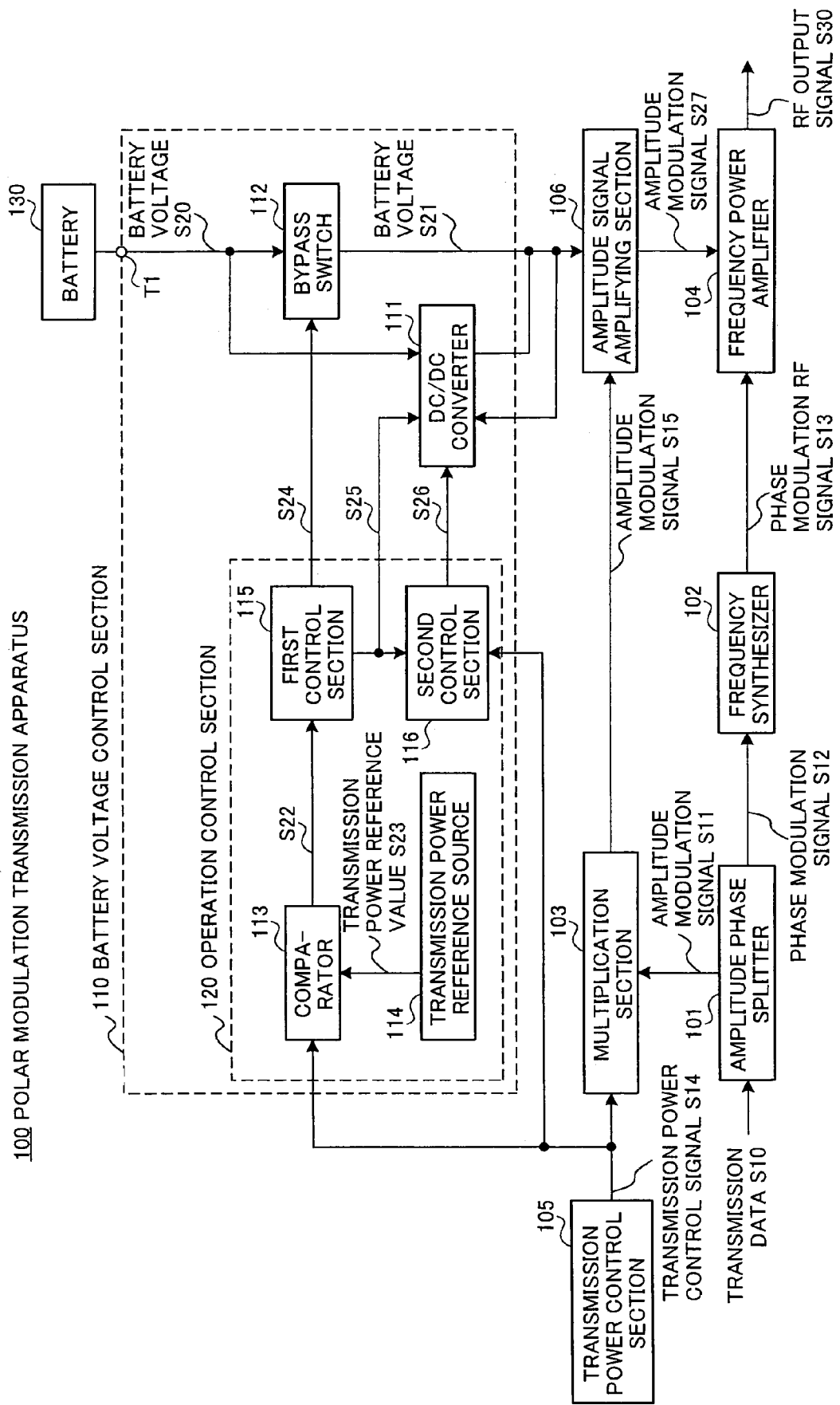
FIG. 3 is a block diagram showing a configuration for polar modulation transmission apparatus of a first embodiment of the present invention.

FIG. 3 shows a configuration for polar modulation transmission apparatus of this embodiment. Polar modulation transmission apparatus 100 is used, for example, in mobile terminals of mobile communication systems, or in base station apparatus carrying out wireless communication with mobile terminal apparatus.

Polar modulation transmission apparatus 100 inputs transmission data S10 to amplitude phase splitter 101. Amplitude phase splitter 101 forms amplitude modulation signal S11 (for example, $\sqrt{(I^2+Q^2)}$) and phase modulation signal S12 expressing transmission data S10 in polar coordinates, and sends amplitude modulation signal S11 to multiplication section 103 and phase modulation signal S12 to frequency synthesizer 102. Frequency synthesizer 102 forms phase modulation RF signal S13 by modulating a carrier wave using phase modulation signal S12, and transmits this to a signal input terminal of frequency power amplifier 104.

In addition to amplitude modulation signal S1, transmission power control signal S14 outputted from transmission power control section 105 is inputted to multiplication section 103. Multiplication section 103 forms amplitude modulation signal S15 by multiplying transmission power control signal S14 with amplitude modulation signal S11. Here, transmission power control signal S14 is a signal controlling transmission power (power of RF output signal S30 outputted from high-frequency power amplifier 104), and is, for example, a high-level signal in the event that the distance to communication party apparatus is close, and is a low-level signal in the event that the distance is far. Multiplication section 103 forms amplitude modulation signal S15 reflecting transmission power in this way and transmits this to amplitude signal amplifying section 106.

In addition to this configuration, polar modulation transmission apparatus 100 has battery voltage control section 110 controlling battery voltage S21 of amplitude signal amplifying section 106.

Battery voltage control section 110 is connected to output terminal T1 of battery 130 and is inputted with a power supply from the battery 110. Battery voltage control section 110 has a DC/DC converter 111 taken as a battery voltage conversion section. DC/DC converter 111 converts battery voltage S20 generated by battery 130 to battery voltage S21 and applies this battery voltage S21 to a battery terminal of amplitude signal amplifying section 106. By this means, power loss at amplitude signal amplifying section 106 can be made small. Specifically, power loss at amplitude signal amplifying section 106 is suppressed by forming battery voltage S21 in such a manner that difference in potential with amplitude modulation signal S27 outputted by amplitude signal amplifying section 106 is small.

Here, amplitude signal amplifying section 106 is configured from, for example, a linear regulator, and forms amplitude modulation signal S27 by carrying out power amplification. Amplitude signal amplifying section 106 operates at a lower power loss for a smaller difference in potential between battery voltage S21 applied to a battery terminal and outputted amplitude modulation signal S27.

In addition, battery voltage control section 110 has a bypass switch 112. Bypass switch 112 is provided on a battery line directly connecting battery 130 and amplitude signal amplifying section 106. At the time of ON operation, battery voltage S20 from battery 130 is applied directly to the battery terminal of amplitude signal amplifying section 106 without going via DC/DC converter 111.

In this way, at battery voltage control section 110 of this embodiment, a battery voltage converted by DC/DC converter 111 is applied to a battery terminal of amplitude signal amplifying section 106, or battery voltage S20 is directly applied by battery 130 via bypass switch 112.

The selection operation is controlled by operation control section 120. Operation control section 120 inputs transmission power control signal S14 to comparator 113. Comparator 113 compares a transmission power value indicated by transmission power control signal S14 and transmission power reference value S23 from transmission power reference source 114 and transmits a comparison result signal S22 to first control section 115.

In the event that comparison result signal S22 indicates that the transmission power value indicated by transmission power control signal S14 exceeds transmission power reference value S23, first control section 115 transmits switching control signal S24 for causing bypass switch 112 to work in ON operation to bypass switch 112. On the other hand, in the event that comparison result signal S22 indicates that the transmission power value indicated by transmission power control signal S14 is less than transmission power reference value S23, first control section 115 transmits switching control signal S24 for causing bypass switch 112 to work in OFF operation to bypass switch 112.

Further, in the event that comparison result signal S22 indicates that the transmission power value indicated by transmission power control signal S14 exceeds transmission power reference value S23, control signal S25 for causing DC/DC converter 111 and second control section 116 to work in OFF operation is sent to DC/DC converter 111 and second control section 116. On the other hand, in the event that comparison result signal S22 indicates that transmission power indicated by transmission power control signal S14 is less than transmission power reference value S23, control signal S25 for causing DC/DC converter 111 and second control section 116 to work in ON operation is sent to DC/DC converter 111 and second control section 116.

In this way, at the operation control section 120, control is exerted in such a manner that DC/DC converter 111 is operated and battery voltage S21 is converted by DC/DC converter 111 and applied to the battery terminal of amplitude signal amplifying section 106, or DC/DC converter 111 is stopped and battery voltage S20 is applied directly from battery 130 via bypass switch 112, based on transmission power control signal S14.

Second control section 116 is inputted with transmission power control signal S14 and outputs control signal S26 controlling the conversion operation of DC/DC converter 111 based on the transmission power value indicated by transmission power control signal S14. Specifically, a center level of the amplitude of amplitude modulation signal S27 is estimated from transmission power control signal S14 and DC/DC converter 111 is then controlled in such a manner as to form battery voltage S21 of a small difference in potential with amplitude modulation signal S27. Incidentally, DC/DC converter 111 is configured in such a manner as to form battery voltage S21 of the same value as the reference voltage value by operating in such a manner as to feed back the output voltage at the time of ON operation in such a manner that the output voltage and the reference voltage match. Namely, control signal S26 outputted from second control section 116 is for setting the reference voltage value.

Next, a description will be given of the operation of this embodiment centered mainly on the operation of battery voltage control section 110.

First, battery voltage control section 110 compares transmission power reference value S23 outputted by transmission power reference source 114 and a transmission power value indicated by transmission power control signal S14 by means of comparator 113.

In the event that the comparison results indicate that the transmission power value is less than transmission power reference value S23, battery voltage control section 110 causes DC/DC converter 111 to operate and causes bypass switch 112 to work in OFF operation. As a result, the difference in potential of amplitude Modulation signal S27 and battery voltage S21 when voltage level (center voltage level) of amplitude modulation signal S27 is low can be made small and power loss at amplitude signal amplifying section 106 can therefore be suppressed.

On the other hand, in the event that comparison results indicate that transmission power exceeds transmission power reference value S23, battery voltage control section 110 halts operation of DC/DC converter 111 and makes bypass switch 112 work in ON operation so that battery voltage S20 of battery 130 is applied to the battery terminal of amplitude signal amplifying section 106 as battery voltage S21. In this way, when the voltage level (center voltage level) of amplitude modulation signal S27 is high, power loss at DC/DC converter 111 due to unnecessary operation of DC/DC converter 111 can be eliminated. The difference in potential between battery voltage S20 and amplitude modulation signal S27 is small in the event that the voltage level (center voltage level) of amplitude modulation signal S27 is high. The power loss therefore becomes small at amplitude signal amplifying section 106 even if the battery voltage is not changed by DC/DC converter 111.

Figure 4:
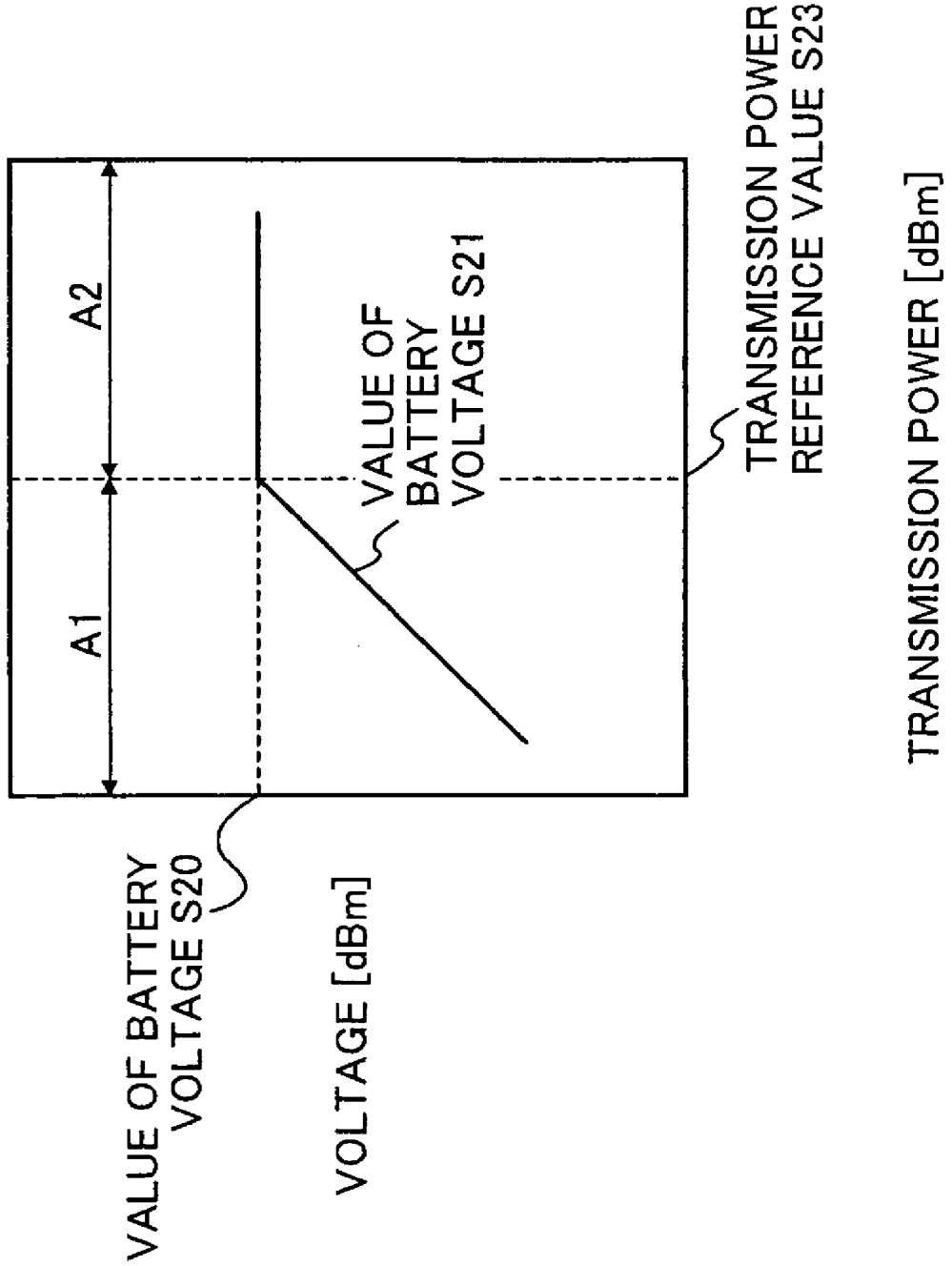
FIG. 4 is a characteristic view illustrating the operation of a battery voltage control section of the first embodiment.

As shown in FIG. 4, battery voltage control section 110 forms battery voltage S21 according to transmission power and supplies this to the battery terminal of amplitude signal amplifying section 106. Incidentally, region A1 in the drawings shows a region where it is possible to make power loss at amplitude signal amplifying section 106 small by lowering battery voltage S21 at DC/DC converter 111, and region A2 shows a region where the effect of lowering the battery voltage S21 is not obtained where the power loss due to operation of DC/DC converter 111 is greater than the power loss at the amplitude signal amplifying section 106.

Transmission power reference source 114 preferably forms transmission power reference value S23 corresponding to a boundary value of these regions A1, A2. In reality, setting transmission power reference value S23 at the point where the amount of improvement of power loss at amplitude signal amplifying section 106 when battery voltage S21 is reduced and the operating power of DC/DC converter 111 is cancelled out is optimum with regards to reducing the amount of power consumed.

Region A1 is the state where the DC/DC converter 111 is operating, and region A2 is the state where battery voltage S20 is supplied directly to amplitude signal amplifying section 106 via bypass switch 112.

In the case of this embodiment, as shown in region A1, second control section 116 controls DC/DC converter 111 in such a manner that battery voltage S21 is attenuated at a fixed slope in accordance with transmission power becoming small. As a result, it is possible to avoid amplitude distortion at amplitude signal amplifying section 106. In other words, coupled with the characteristics of amplitude signal amplifying section 106, second control section 116 controls DC/DC converter 111 in such a manner that battery voltage S21 is formed with a slope such that amplitude distortion does not occur at amplitude signal amplifying section 106.

According to this embodiment, power loss at a battery supply line to high-frequency power amplifier 104 can be suppressed regardless of whether transmission power is high or low by providing DC/DC converter 111 converting a battery voltage from battery 130 for supply to a battery terminal of amplitude signal amplifying section 106 in such a manner that power loss at amplitude signal amplifying section 106 becomes small, bypass switch 112 supplying battery voltage S20 of battery 13 directly to amplitude signal amplifying section 106, and operation control section 120 performing control so as to cause DC/DC converter 111 to operate so as to apply converted battery voltage S21 to amplitude signal amplifying section 106 based on transmission power control signal S14, or halt operation of DC/DC converter 111 so as to apply battery voltage S20 directly from battery 130.

Second Embodiment

Figure 5:
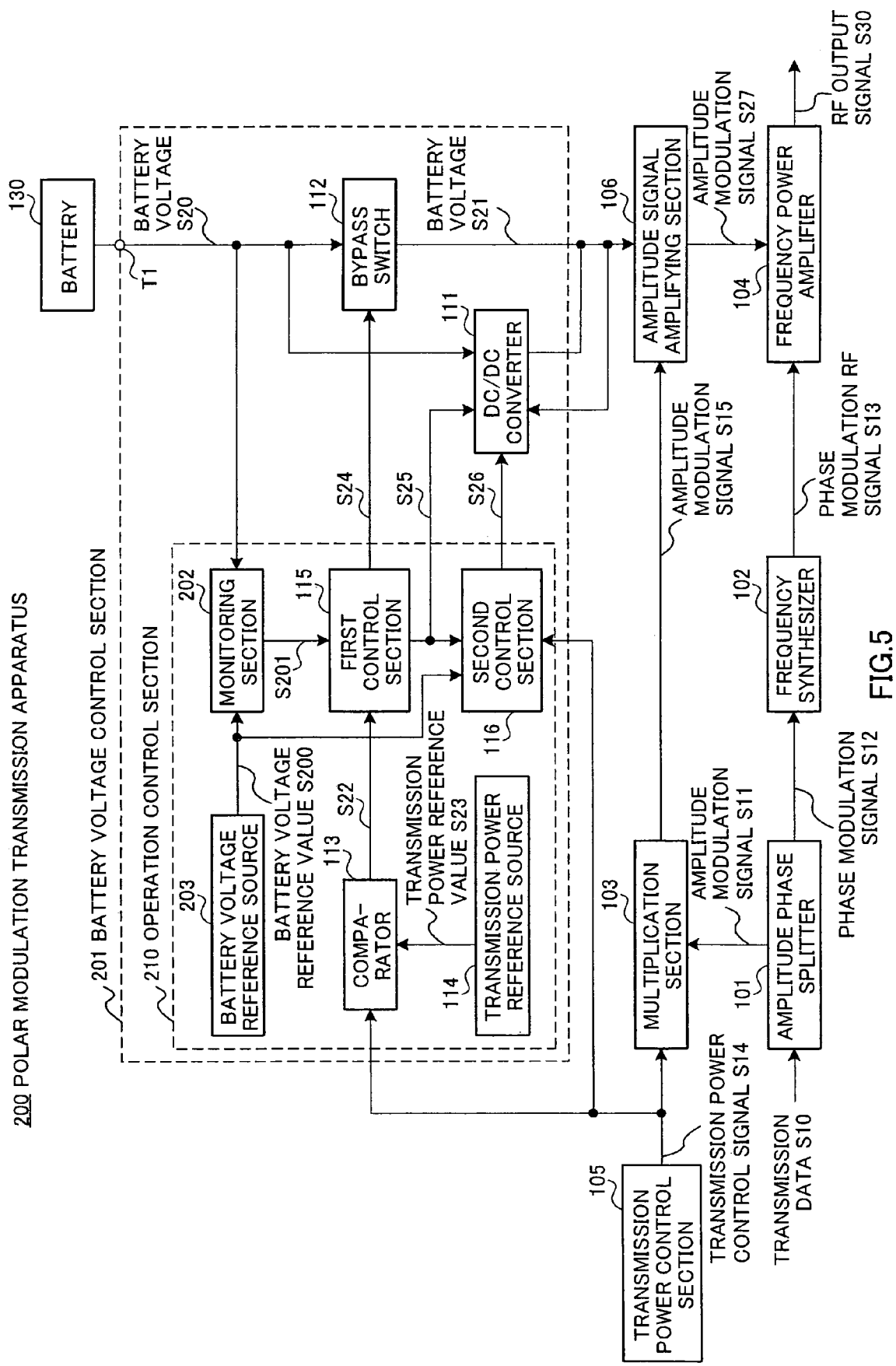
FIG. 5 is a block diagram showing a configuration for polar modulation transmission apparatus of a second embodiment of the present invention.

A configuration for a polar modulation transmission apparatus of this embodiment is shown in FIG. 5, with portions corresponding to FIG. 3 being given the same numerals. Polar modulation transmission apparatus 200 is such that the configuration of operation control section 210 of battery voltage control section 201 is different compared to polar modulation transmission apparatus 100 of FIG. 3.

Operation control section 210 has a monitoring section 202 monitoring battery voltage S20 of battery 130. Monitoring section 202 is inputted with battery voltage S20 of battery 130 and battery voltage reference value S200 from battery voltage reference source 203.

When battery voltage S20 becomes larger than battery voltage reference value S200, monitoring section 202 sends detection signal S201 indicating this to first control section 115. When detection signal S201 indicating that battery voltage S20 has become larger than battery voltage reference value S200 is inputted, first control section 115 sends switching control signal S24 controlling bypass switch 112 to be off, and sends control signal S25 controlling second control section 116 and DC/DC converter 111 to be on.

At this time, second control section 116 sends control signal S26 requesting, forming of a fixed battery voltage S21 to DC/DC converter 111. Specifically, second control section 116 performs control in such a manner that DC/DC converter 111 forms fixed battery voltage S21 equal to battery voltage reference value S200.

Next, the operation of this embodiment will be described mainly with regards to differences with the first embodiment.

In the event that an indication that transmission power value exceeds transmission power reference value S23 is obtained as comparison results of comparator 113, and an indication that battery voltage S106 exceeds battery voltage reference value S200 is obtained as monitoring results of monitoring section 202, battery voltage control section 201 makes DC/DC converter 111 work in ON operation, and makes bypass switch 112 work in OFF operation. A fixed battery voltage S21 is then formed by DC/DC converter 111 and supplied to amplitude signal amplifying section 106.

Figures 6A, 6B:
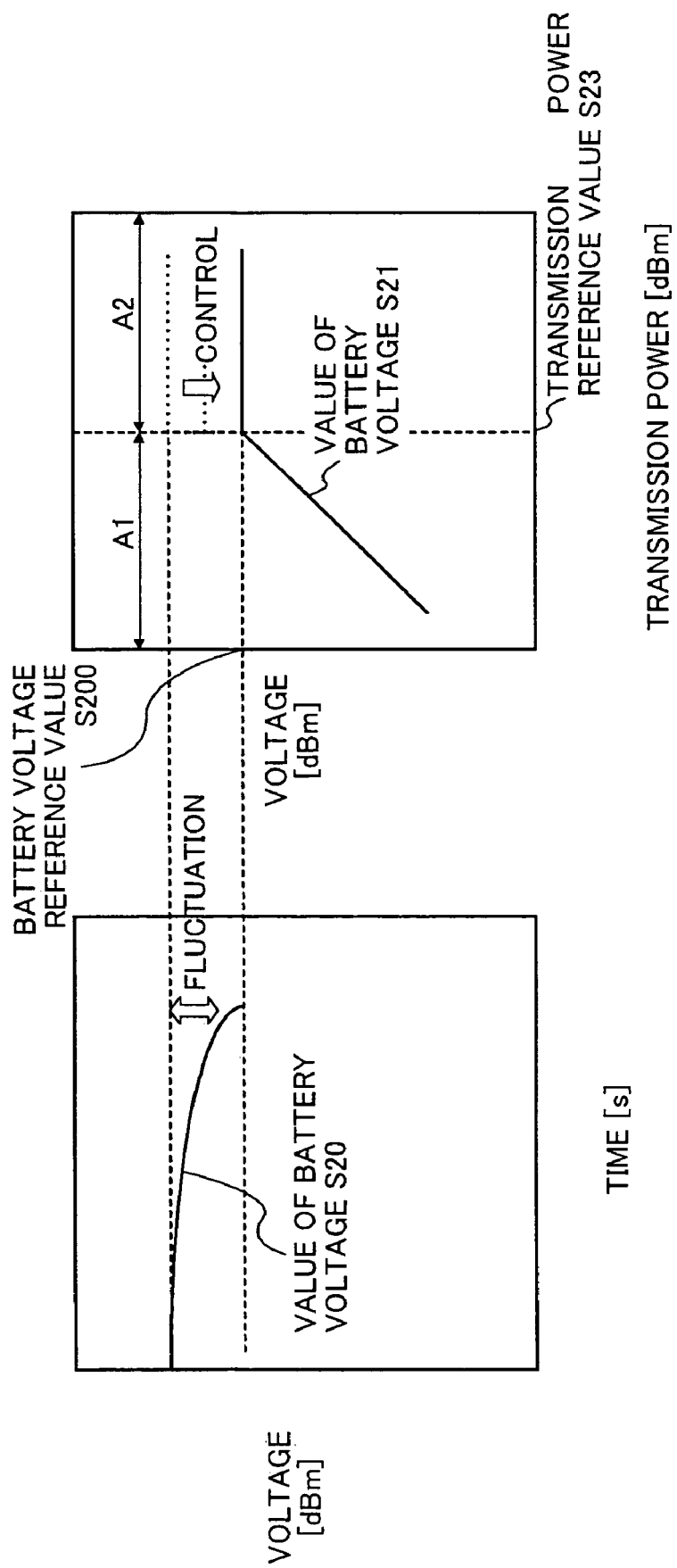
FIG. 6A is a view showing fluctuation of battery voltage.
FIG. 6B is a view showing the situation where battery voltage is forced down to a battery voltage reference value.

This situation is shown in FIG. 6. In the event that battery 130 is configured from a cell, as shown in FIG. 6A, battery voltage S20 fluctuates due to discharge, etc. At battery voltage control section 210 of this embodiment, even in the case where transmission power is greater than transmission power reference value S23, or in the case where battery voltage S20 is greater than battery voltage reference value S200, as shown in FIG. 6B, it is possible to suppress power loss at amplitude signal amplifying section 106 caused by fluctuation of battery voltage S20 due to discharge etc. by forcibly lowering battery voltage S20 down to battery voltage reference value S200 by means of DC/DC converter 111.

Here, setting battery voltage reference value S200 at the point where the amount of improvement of power loss at amplitude signal amplifying section 106 when battery voltage S20 is lowered and the operating power of DC/DC converter 111 is cancelled out is optimum with regards to reducing the amount of power consumed.

According to this embodiment, in addition to the configuration of the first embodiment, a monitoring section 202 monitoring battery voltage S20 of battery 130 is provided. Therefore, even in cases where transmission power value is greater than transmission power reference value S23, or in cases where battery voltage S20 is greater than battery voltage reference value S200, by forcibly changing battery voltage S20 to a fixed battery voltage reference value S200 by means of DC/DC converter 111, in addition to the advantages of the first embodiment, even in cases where battery voltage S20 of battery 130 fluctuates due to discharge etc., it is possible to reduce power loss at amplitude signal amplifying section 106.

Third Embodiment

Figure 7:
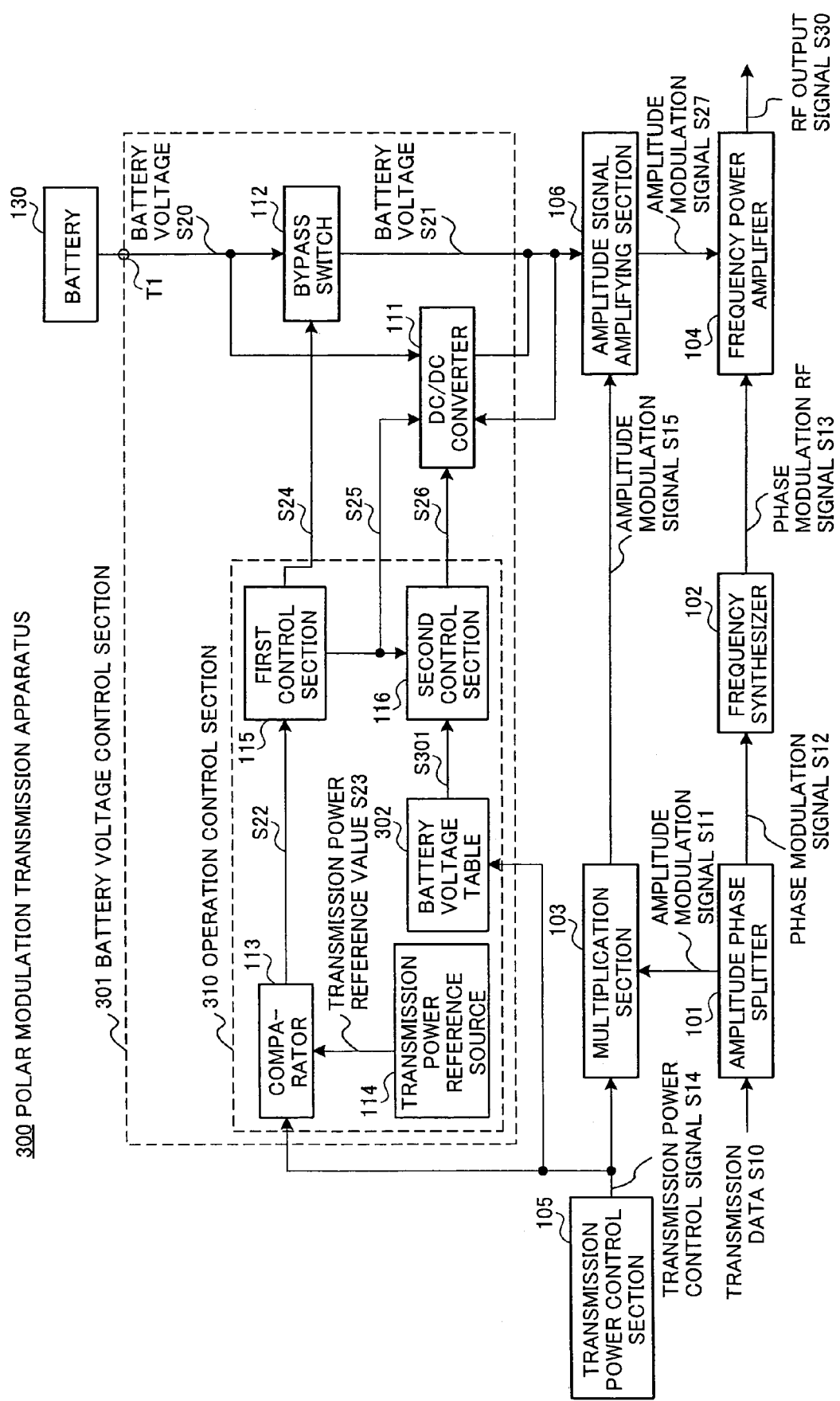
FIG. 7 is a block diagram showing a configuration for polar modulation transmission apparatus of a third embodiment of the present invention.

A configuration for a polar modulation transmission apparatus of this embodiment is shown in FIG. 7, with portions corresponding to FIG. 3 being given the same numerals. Polar modulation transmission apparatus 300 is such that the configuration of operation control section 310 of battery voltage control section 301 is different compared to polar modulation transmission apparatus 100 of FIG. 3.

Operation control section 310 has a battery voltage table 302 that second control section 116 refers to while controlling the battery voltage conversion operation of DC/DC converter 111.

Figures 8A, 8B:
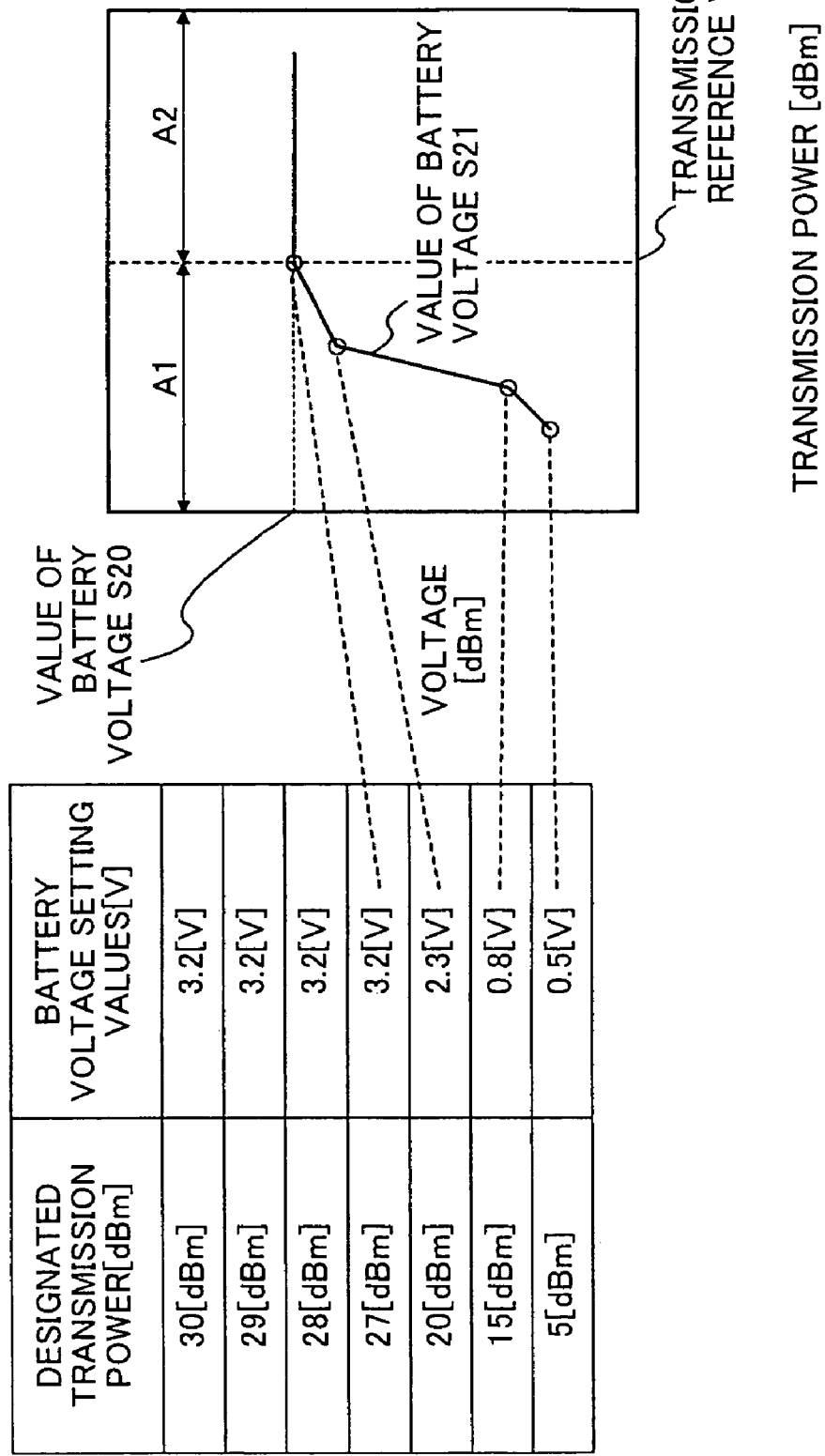
FIG. 8 is a view showing a relationship between contents of a battery voltage table (FIG. 8A) and operation of a battery voltage control section (FIG. 8B)

As shown in FIG. 8A, battery voltage table 302 associates designated transmission power values (corresponding to transmission power control signal S14) and battery voltage setting values. Battery voltage table 302 sends battery voltage setting value S301 corresponding to the inputted transmission power control signal S14 to second control section 116. Battery voltage setting values stored in battery voltage table 302, coupled with the characteristics of amplitude signal amplifying section 106, are values selected in such a manner that power loss becomes minimal at amplitude signal amplifying section 106 when each transmission power is designated.

As a result, as in the first embodiment, compared with the case where battery voltage S21 is attenuated at a fixed slope in accordance with transmission power value becoming smaller, power loss can be further reduced at amplitude signal amplifying section 106.

Second control section 116 controls the voltage conversion operation of DC/DC converter 111 in such a manner that battery voltage S21 obtained by DC/DC converter 111 becomes equal to battery voltage setting value S301. Incidentally, as shown in FIG. 8A and FIG. 8B, second control section 116 is such that voltage values between battery voltage setting values designated by battery voltage table 302 are linearly interpolated. By this means, it is possible to suppress amplitude distortion at amplitude signal amplifying section 106.

According to this embodiment, in addition to the configuration of the first embodiment, battery voltage table 302 storing battery voltage values for amplitude signal amplifying section 106 capable of achieving minimum power loss at amplitude signal amplifying section 106 every transmission power value is provided. By then controlling battery voltage S21 formed by DC/DC converter 111 based on battery voltage values of battery voltage table 302, in addition to the advantages of the first embodiment, it is possible for power loss at amplitude signal amplifying section 106 to be further reduced compared to the first embodiment.

Fourth Embodiment

Figure 9:
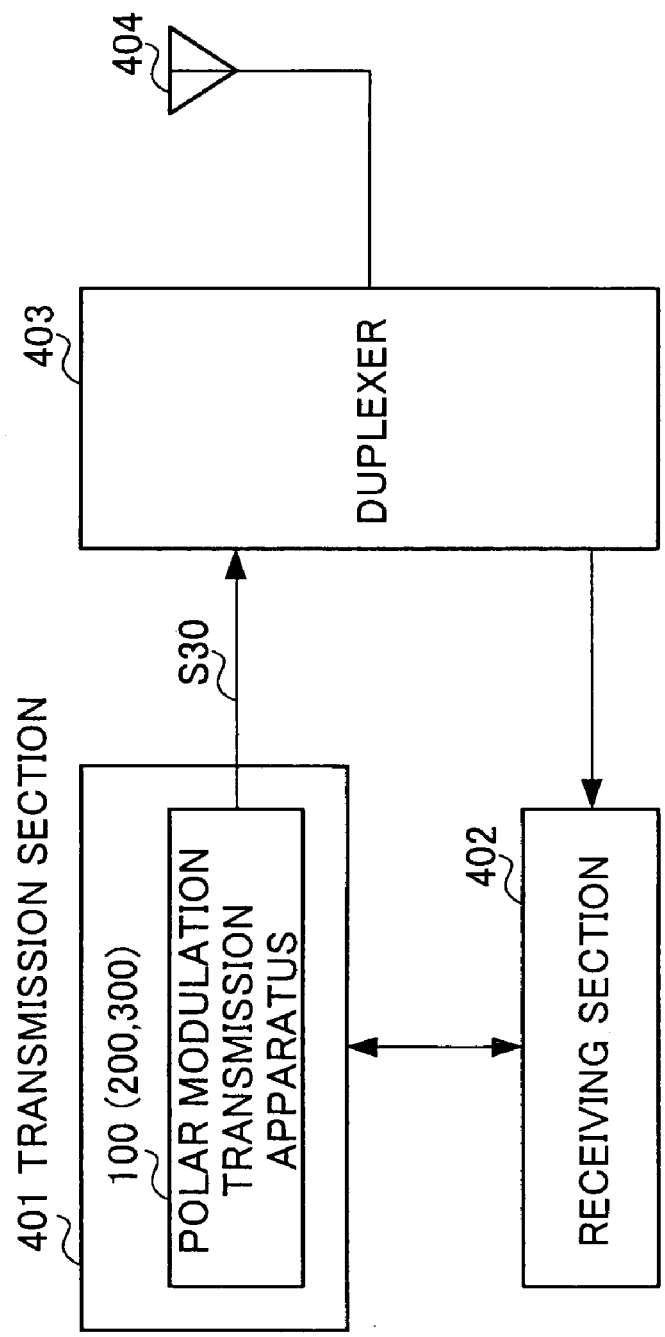
FIG. 9 is a block diagram showing a configuration of wireless communication apparatus of a fourth embodiment.

A configuration for wireless equipment of this embodiment is shown in FIG. 9. Wireless communication apparatus 400 is constituted by a communication terminal such as, for example, a mobile telephone etc., or a base station thereof.

Wireless communication apparatus 400 is comprised of transmission section 401, receiving section 402, duplexer 403, and antenna 404. The polar modulation transmission apparatus 100, 200 or 300 described in the first to third embodiments is provided at transmission section 401, and RF output signal S30 formed by polar modulation transmission apparatus 100, 200, or 300 is irradiated from antenna 404 via duplexer 403. Further, wireless communication apparatus 400 inputs a signal received by antenna 404 to receiving section 402 via duplexer 403. Receiving section 402 demodulates data etc. transmitted from a communicating party station by subjecting the received signal to predetermined receiving processing.

According to this embodiment it is possible to implement wireless communication apparatus 400 of low power loss by mounting the polar modulation transmission apparatus 100, 200, or 300 of the first to third embodiments. For example, in the case of a mobile telephone, it is possible to make the possible call duration long.

As in the first to fourth embodiments described above, a polar modulation transmission apparatus of a first aspect of the present invention comprises: a high frequency power amplifying section capable of subjecting a phase modulated high frequency signal to power amplification according to a voltage applied to a battery terminal of the high frequency power amplifying section; an amplitude signal amplifying section, amplifying and applying to the battery terminal of the high frequency power amplifying section an amplitude modulation signal according to a voltage value applied from a battery to a battery terminal of the amplitude signal amplifying section; a battery voltage conversion section converting and applying to the battery terminal of the amplitude signal amplifying section a battery voltage from the battery in such a manner that power loss at the amplitude signal amplifying section becomes small; and an operation control section causing the battery voltage conversion section to operate so as to apply the battery voltage converted by the battery voltage conversion section to the battery terminal of the amplitude signal amplifying section or halt operation of the battery voltage conversion section so as to apply the battery voltage from the battery directly, based on a transmission power value.

According to another aspect of the present invention, with the polar modulation transmission apparatus of the first aspect of the present invention, the operation control section comprises a comparison section comparing the magnitude of the transmission power value with a predetermined reference value; a first control section causing the battery voltage conversion section to operate so that the battery voltage converted by the battery voltage conversion section is applied to the battery terminal of the amplitude signal amplifying section in the event that the transmission power value is less than or equal to the reference value, and causing the operation of the battery voltage conversion section to stop so that the battery voltage is applied from the battery directly in the event that the transmission power value is larger than the reference value; and a second control section controlling a conversion voltage value of the battery voltage conversion section based on the transmission power value.

According to these configurations, the operation control section causes the battery voltage conversion section to operate so as to apply the battery voltage converted by the battery voltage conversion section to the battery terminal of the amplitude signal amplifying section or halt operation of the battery voltage conversion section so as to apply the battery voltage from the battery directly, based on a transmission power value. Power loss of a battery supply line to the high-frequency power amplifying section is therefore suppressed regardless of whether transmission power is high or low. That is, in the event that the transmission power value is low, it is possible to make the difference in potential between the battery voltage at the amplitude signal amplifying section and the output signal small by causing the battery voltage conversion section to operate so that the battery voltage converted by the battery voltage conversion section is applied to the battery terminal of the amplitude signal amplifying section. It is therefore possible to suppress power loss at the amplitude signal amplifying section. On the other hand, in the event that the transmission power value is high, operation of the battery voltage conversion section is halted and battery voltage from the battery is applied directly to the amplitude signal amplifying section so that completion is possible without unnecessary operation of the battery voltage conversion section. This means that unnecessary power loss at the battery voltage conversion section is eliminated.

In one aspect of the polar modulation transmission apparatus of the present invention, a configuration is adopted where the second control section controls the battery voltage conversion section in accordance with the transmission power value becoming smaller in such a manner that the conversion voltage value attenuates with a fixed slope.

According to this configuration, it is possible to avoid amplification distortion at amplitude signal amplifying section.

In one aspect of a polar modulation transmission apparatus of the present invention, an operation control section is further provided with a monitoring section comparing and monitoring the magnitude of a battery voltage outputted from the battery and a predetermined reference value. A configuration is then adopted where, even in the event where a comparison result is obtained by the comparison section where the transmission power value is larger than the reference value, in the event that a comparison result is obtained by the monitoring section where the magnitude of the battery voltage outputted by the battery is larger than the reference value, the first control section causes the battery voltage conversion section to operate in such a manner that the battery voltage converted by the battery voltage conversion section is applied to the battery terminal of the amplitude signal amplifying section.

According to this configuration, power loss at the amplitude signal amplifying section can be reduced even in cases where battery voltage of the battery fluctuates due to discharge etc.

In one aspect of a polar modulation transmission apparatus of the present invention, the operation control section is further provided with a table associating transmission power values and conversion voltage values of the battery voltage conversion section. The second control section reads a conversion voltage value corresponding to a designated transmission power value from the table and controls the battery voltage conversion section in such a manner that the conversion voltage value of the battery voltage conversion section becomes the conversion voltage value read from the table.

According to this configuration, in addition to the characteristics of the amplitude signal amplifying section, relationships between transmission power values and conversion voltage values can be stored in advance in a table in such a manner that power loss of the amplitude signal amplifying section becomes a minimum. The power loss at the amplitude signal amplifying section is therefore further reduced.

A wireless communication apparatus of the present invention adopts a configuration equipped with any of the above polar modulation transmission apparatus.

According to this configuration, power loss at the mounted polar modulation transmission apparatus can be suppressed so that in the case of a mobile telephone, for example, the duration of call can be made longer.

The present invention is not limited to the above described embodiments, and various variations and modifications may be possible without departing from the scope of the present invention.

This application is based on Japanese Patent Application No. 2005-058948, filed on Mar. 3, 2005, the entire content of which is expressly incorporated by reference herein.

What is claimed is:

1. A polar modulation transmission apparatus comprising:
   a high frequency power amplifying section capable of subjecting a phase modulated high frequency signal to power amplification according to a voltage applied to a battery terminal of the high frequency power amplifying section;
   an amplitude signal amplifying section, amplifying and applying to the battery terminal of the high frequency power amplifying section an amplitude modulation signal according to a voltage value applied from a battery to a battery terminal of the amplitude signal amplifying section;
   a battery voltage conversion section converting and applying to the battery terminal of the amplitude signal amplifying section a battery voltage from the battery in such a manner that power loss at the amplitude signal amplifying section becomes small; and
   an operation control section causing the battery voltage conversion section to operate so as to apply the battery voltage converted by the battery voltage conversion section to the battery terminal of the amplitude signal amplifying section or halt operation of the battery voltage conversion section so as to apply the battery voltage from the battery directly, based on a transmission power value.

2. The polar modulation transmission apparatus according to claim 1, wherein the operation control section comprises:
   a comparison section comparing the magnitude of the transmission power value with a predetermined reference value;
   a first control section causing the battery voltage conversion section to operate so that the battery voltage converted by the battery voltage conversion section is applied to the battery terminal of the amplitude signal amplifying section in the event that the transmission power value is less than or equal to the reference value, and causing the operation of the battery voltage conversion section to stop so that the battery voltage is applied from the battery directly in the event that the transmission power value is larger than the reference value; and
   a second control section controlling a conversion voltage value of the battery voltage conversion section based on the transmission power value.

3. The polar modulation transmission apparatus according to claim 2, wherein the second control section controls the battery voltage conversion section in accordance with the transmission power value becoming smaller in such a manner that the conversion voltage value attenuates with a fixed slope.

4. The polar modulation transmission apparatus according to claim 1, wherein:
   the operation control section further comprises a monitoring section comparing and monitoring the magnitude of a battery voltage outputted from the battery and a predetermined reference value; and
   even in the event where a comparison result is obtained by the comparison section where the transmission power value is larger than the reference value, in the event that a comparison result is obtained by the monitoring section where the magnitude of the battery voltage outputted by the battery is larger than the reference value, the first control section causes the battery voltage conversion section to operate in such a manner that the battery voltage converted by the battery voltage conversion section is applied to the battery terminal of the amplitude signal amplifying section.

5. The polar modulation transmission apparatus according to claim 1, wherein:
   the operation control section further comprises a table associating transmission power values and conversion voltage values of the battery voltage conversion section; and
   the second control section reads a conversion voltage value corresponding to a designated transmission power value from the table and controls the battery voltage conversion section in such a manner that the conversion voltage value of the battery voltage conversion section becomes the conversion voltage value read from the table.

6. A wireless communication apparatus equipped with the polar modulation transmission apparatus according to claim 1.

7. A polar modulation transmission method comprising:
   a high frequency power amplifying step of subjecting a phase modulated high frequency signal to power amplification according to a battery voltage value;
   an amplitude signal amplifying step of amplifying an amplitude modulation signal and forming a battery voltage used in the high frequency power amplifying step;
   a battery voltage conversion step of converting a battery voltage from a battery in such a manner that power loss in the amplitude signal amplifying step becomes small; and
   an operation control step of exerting control in such a manner that the amplitude signal amplifying step is carried out using the voltage converted by carrying out the battery voltage conversion step, or the amplitude signal amplifying step is carried out using the battery voltage directly from the battery without carrying out the battery voltage conversion step, based on a transmission power value.

* * * * *